(12) United States Patent
Thelissen et al.

(10) Patent No.: US 7,508,205 B2
(45) Date of Patent: Mar. 24, 2009

(54) MAGNETIC RESONANCE IMAGING SYSTEM, A METHOD OF MAGNETIC RESONANCE IMAGING AND A COMPUTER PROGRAM

(75) Inventors: Guillaume Rudolf Petrus Thelissen, Eindhoven (NL); Clemens Bos, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 152 days.

(21) Appl. No.: 11/568,325

(22) PCT Filed: Apr. 27, 2005

(86) PCT No.: PCT/IB2005/051379

§ 371 (c)(1),
(2), (4) Date: Oct. 26, 2006

(87) PCT Pub. No.: WO2005/106520

PCT Pub. Date: Nov. 10, 2005

(65) Prior Publication Data

US 2007/0216410 A1    Sep. 20, 2007

(30) Foreign Application Priority Data

Apr. 29, 2004    (EP) .................................. 04300241

(51) Int. Cl.
*G01V 3/00*    (2006.01)
(52) U.S. Cl. ....................... 324/307; 324/309
(58) Field of Classification Search ......... 324/300–322; 600/407–445
See application file for complete search history.

(56) References Cited

U.S. PATENT DOCUMENTS

| | | | |
|---|---|---|---|
| 5,711,300 A * | 1/1998 | Schneider et al. | 600/412 |
| 5,810,888 A | 9/1998 | Fenn | |
| 6,064,206 A * | 5/2000 | Van Vaals et al. | 324/312 |
| 6,377,834 B1 * | 4/2002 | Zhou et al. | 600/412 |
| 6,445,183 B1 | 9/2002 | Shimizu et al. | |
| 6,516,211 B1 * | 2/2003 | Acker et al. | 600/411 |
| 6,618,608 B1 | 9/2003 | Watkins et al. | |
| 2004/0015071 A1 | 1/2004 | Komura et al. | |
| 2005/0065429 A1 * | 3/2005 | Zhou | 600/412 |

OTHER PUBLICATIONS

Cline, H.E., et al.; Simultaneous Magnetic Resonance Phase and Magnitude Temperature Maps in Muscle; 1996; MRM; 35:309-315.

(Continued)

*Primary Examiner*—Brij B Shrivastav

(57) ABSTRACT

A magnetic resonance imaging system (1) includes a data acquisition system (11) with a main magnet (12) with an imaging volume. A gradient system (G) generates field gradients (Gx), (Gy) and (Gz). An RF excitation system (10) generates radio-frequency (RF) excitation pulses. In a receiving mode, an RF coil senses a response, for example in the form of free induction decay signals, including echo signals. An image processor (26) is arranged to extract thermometry data and longitudinal relaxation time data from the acquired MR signals and to forward corresponding reconstructed images to a display unit (28).

17 Claims, 5 Drawing Sheets

OTHER PUBLICATIONS

Figure 1:
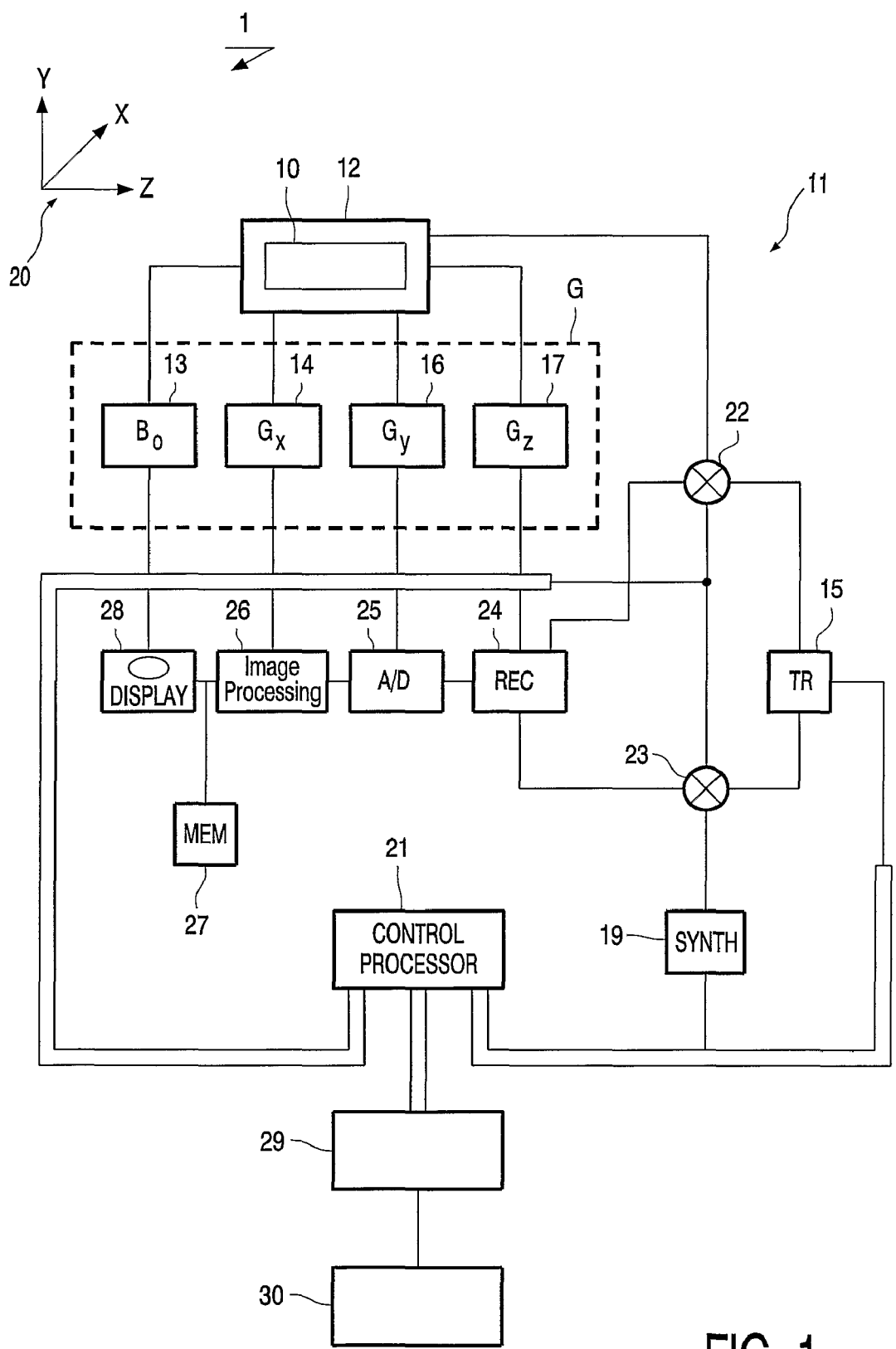

De Zwart, J.A., et al.; On the Feasibility of Local Drug Delivery Using Thermo-Sensitive Liposomes and MR-Guided Focused Ultrasound; 2000; Proc. Intl. Mag. Reson. Med.; 8; p. 43.

Look, D.C., et al.; Time saving measurement of NMR and EPR Relaxation Times; 1970; Rev. Sci. Instrum.; vol. 41; p. 250.

Moonen, C.T.W.; MR temperature mapping in local drug delivery and thermotherapy; 2000; Medical Mundi; 43(3) 34-42.

Quesson, B., et al.; Automatic Control of Hyperthermic Therapy Based on Real-Time Fourier Analysis of MR Temperature Maps; 2002; MRM; 47:1065-1072.

Yatvin, M.B., et al.; Design of Liposomes for Enhanced Local Release of Drugs by Hyperthermia; 1978; Science; vol. 202; pp. 1290-1293.

* cited by examiner

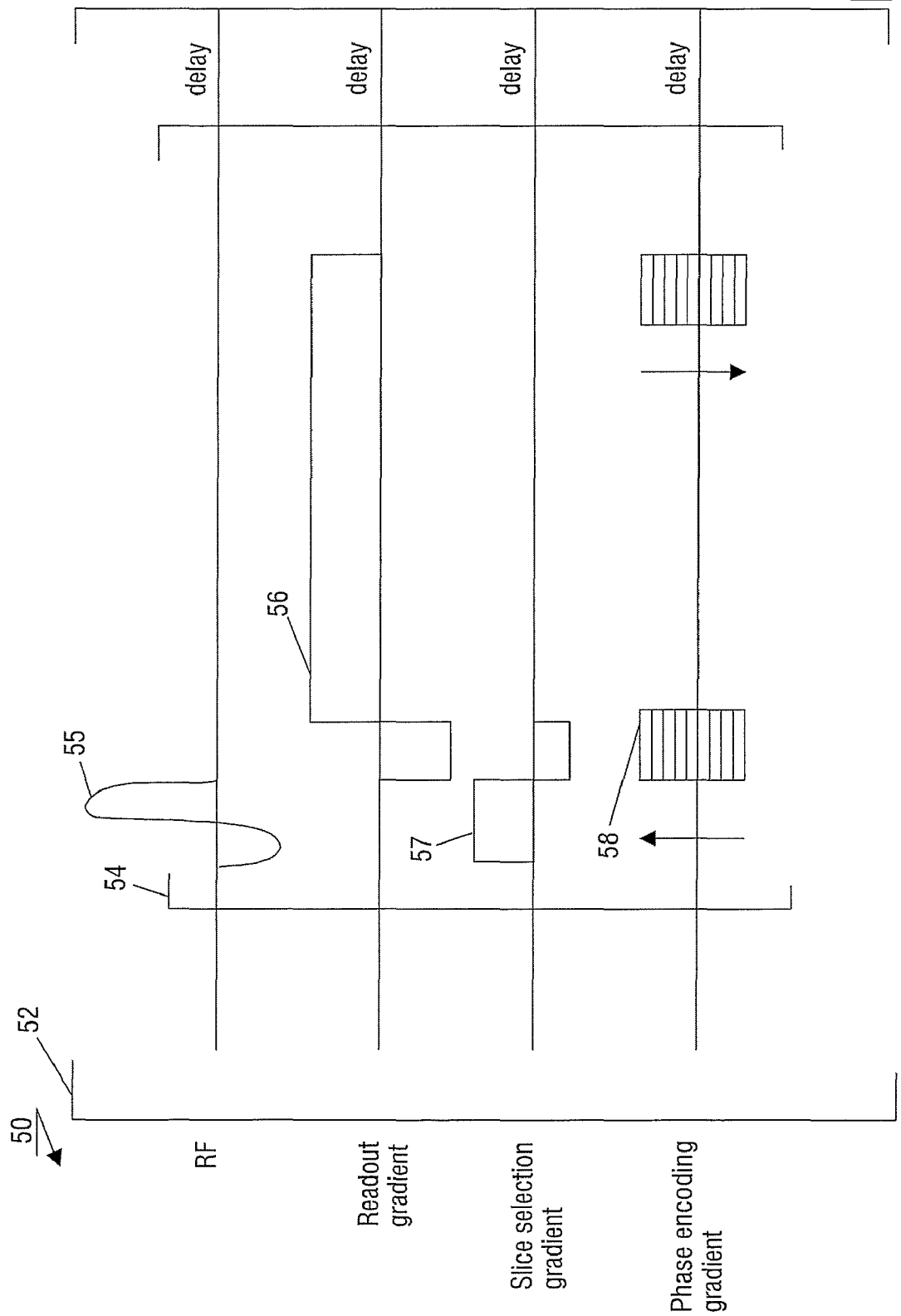

MAGNETIC RESONANCE IMAGING SYSTEM, A METHOD OF MAGNETIC RESONANCE IMAGING AND A COMPUTER PROGRAM

The invention relates to a magnetic resonance imaging system comprising
a data acquisition system with a
a main magnet for generating a magnetic field in an imaging volume,
a gradient system for generating a gradient in said magnetic field;
an RF excitation system arranged for generating a radio-frequency wave in the imaging volume, said radio-frequency wave being conceived to interact with a matter to be positioned in the imaging volume;
an acquisition means arranged to detect a signal representative of a response of the matter to said radio-frequency wave, said magnetic resonance imaging system further comprising
a control system arranged to operate the data acquisition system for generating a dataset comprising a plurality of signals and
a reconstructor operable to reconstruct an image based on said dataset.

The invention further relates to a method of magnetic resonance imaging comprising the step of positioning a matter to be investigated in an imaging volume of a magnetic resonance apparatus.

The invention still further relates to a computer program.

An embodiment of a magnetic resonance imaging system as is set forth in the opening paragraph is known from a publication of Jacco A. de Zwart et al: "On the feasibility of local drug delivery using thermo-sensitive liposomes and MR-guided focused ultrasound", Proc.Int.Soc.Mag.Reson.Med.8 (2000), p. 43. The known magnetic resonance imaging system comprises a magnetic resonance imaging apparatus arranged to provide a signal representative of a response of a phantom subjected to a magnetic resonance excitation. The known system is operable in a known per se gradient echo FLASH mode, whereby the resulting signal is analyzed to extract a phase information from the signal. The phase information is subsequently translated into corresponding temperature information. A suitable method for a translation of the phase information into the temperature information is known per se from U.S. Pat. No. 6,445,183. The known magnetic resonance imaging system is arranged to detect a temperature distribution within the phantom by analysis of the phase signals. In addition to this, the known magnetic resonance imaging system is operable in a further mode, where a change of a longitudinal relaxation time T1 of the phantom is monitored. For this purpose a further excitation sequence is applied in order to acquire a further signal representative of the longitudinal relaxation time T1. In the known magnetic resonance imaging system a known per se magnetic resonance contrast agent is used, which is arranged to locally modify the longitudinal relaxation time T1 in a substance of the investigated phantom. This contrast agent is supplied in an initially impermeable encapsulation, it being a thermo-sensitive liposome, which is arranged to increase its permeability to the contrast agent and/or to the surrounding water upon an event a threshold temperature is reached. Therefore, upon a detection of a substantial change in a local value of the longitudinal relaxation time T1 of the phantom an event of the contrast agent leaving the liposome capsule is detected. This fact is also used to validate at least the fact that a pre-known threshold temperature is reached and also to control the heating device, for example to switching it off manually.

It is a disadvantage of the known magnetic resonance imaging system that a procedure of monitoring the temperature and the longitudinal relaxation time T1 is time consuming, potentially leading to an overheating of the object, as a temperature reading can be validated only upon a completion of a data analysis of the T1-oriented sequence. This may cause an unnecessary tissue damage for in-vivo applications.

It is an object of the invention to provide a magnetic resonance imaging system, wherein a time span between an acquisition of the MR-thermometry data and the longitudinal relaxation data is minimized thus improving an overall reliability of the magnetic resonance imaging system.

To this end in the magnetic resonance imaging system according to the invention the control system is further arranged to form said dataset to comprise a signal phase data and a signal magnitude data, said reconstructor being arranged to reconstruct an image representative of a local thermometry data and a local longitudinal relaxation data using said phase data and said magnitude data.

The technical measure of the invention is based on the insight that it is possible to design a pulse sequence whereby the resulting signal indicative of the response of the matter to the applied pulse sequence comprises both phase data and signal magnitude data. The phase data is used to extract a local temperature in the matter and the magnitude data is used to extract a local change in a longitudinal relaxation time T1. Due to the fact that these data are extractable from a single dataset, the time span is kept at its minimum. It must be noted that the term 'dataset' for the purposes of the present application is defined as a reading of the acquisition means corresponding to a single temporary limited sequence. Examples of suitable sequences for the purpose of the present invention comprise a per se known Proton Resonance Frequency Shift (PRFS) sequence, an Inversion Recovery sequence, as known from D. C. Look and D. R. Locker "Time saving measurement of NMR and EPR Relaxation Times", Rev. Sci. Instrum 1970; 41:250, or a Variable Flip Angle (VPA) sequence. Additionally, a suitable combination of a sequence providing data from which T1 can be determined and a sequence from which a phase shift can be determined is possible. Exemplified embodiments of the pulse sequences will be explained in more detail with reference to FIGS. 2a and 2b. A method of calculating the longitudinal relaxation time T1 from the signal magnitude data is known from D. C. Look and D. R. Locker "Time saving measurement of NMR and EPR Relaxation Times", Rev. Sci. Instrum 1970; 41:250.

According to the technical measure of the invention an additional advantage is provided. In case a contrast agent is employed that is encapsulated in a thermo-sensitive liposome which substantially increases its permeability to the contrast agent and/or to surrounding water upon a threshold temperature being reached, the fact of detecting the contrast agent outside the liposome provides a validation of at least the value of the threshold temperature being factually reached. Thus, two independent sources of temperature measurement are available from a single dataset, firstly the image of the temperature distribution within the matter and, secondly, the T1-image.

In an embodiment of the magnetic resonance imaging system according to the invention, said system further comprises a heating device arranged to locally elevate a temperature in the matter, said magnetic resonance imaging system being further arranged to monitor the local thermometry data in the matter and to control the heating device in accordance with a pre-set control program.

In view of an application, wherein the thermometry data are acquired for purposes of a visualization of an induced local hyperthermia, it is advantageous that the system according to the invention is adapted to monitor the local thermometry data and to automatically control the heating device in accordance therewith. This technical measure optimizes a heating mode by providing a necessary feed-back to the heating device.

In particular, the pre-set control program can be arranged to regulate the heating mode. For example, an output power or a dimension of a focus of a heating means can be changed in relation to the resulting increment in a temperature elevation. Additionally, the heating device may be operated by the system according to the invention to optimize its operational parameters, like a duration of a switch on/switch off period for a pulsed operation. Alternatively, the heating device may be switched off in case a desired measured temperature distribution in the matter is reached. Additionally or alternatively, the pre-set program may comprise a further control signal to the heating device arranged to alter a spatial position of the heated area. For example, the system according to the invention may change the position of the heated area within the matter in accordance with the conventional MR-image presenting the structure of the matter. In case the invention is practiced in-vivo, the system can be advantageously arranged to position a hot spot in a pre-defined anatomical area. Therefore, a fine tuning of the spatial position of the heating area can be accomplished, which reduces unnecessary harm to a healthy tissue due to hyperthermia. This embodiment is particularly suitable for applications with a focused ultrasound, as well as for radio-frequency induced heating, as well as for an interstitial laser ablating. In the latter case, the position of the heating area is conveniently changed by controlling a position of a laser probe of the corresponding heating arrangement. Still alternatively or additionally, the heating device can be controlled to carry-out a dynamic follow-up of a moving object within the matter. For example, a certain cloud of a contrast agent can be followed in space by the hot spot in heamodynamic applications.

In a still further embodiment of the magnetic resonance imaging system according to the invention, said system is further arranged to monitor a change in the signal magnitude data and to generate a further signal representative of said change.

This embodiment of the system according to the invention is particularly suited for applications related to a guiding and monitoring of a high-precision drug deposition. For example, in case a contrast agent having a substantially different longitudinal relaxation time than the matter under investigation is available in the matter, it is possible with the system according to the invention to monitor the change in the signal magnitude data of the matter due to a spread of the contrast agent therein. When the contrast agent has reached a certain pre-defined area, the further signal is generated by the system. This further signal can be used as a validation step, or alternatively or additionally it can be used to control a suitable associated device. For example, in case the invention is practiced in-vivo and the contrast agent is being associated with a pharmaceutical to be deposited in a blood system of a patient by means of a suitable pumping device, an operation of said pumping device may be controlled by the further signal generated by the system. For example, the pumping device may be switched off, or any of its operating parameters may be altered, like a pumping volume, a pumping speed, etc.

In a still further embodiment of the system wherein a contrast agent encapsulated in a thermo-sensitive shield is introduced into the matter, the further signal is generated upon an event of a detection of the contrast agent outside the shield.

A thermo-sensitive liposome can be selected as a suitable shield, as, for example, is known from a publication of Yatvin M B et al., Science 1978; 20:1920. According to the technical measure of the invention, whereby both the temperature distribution and the longitudinal relaxation time are being simultaneously acquired, the liposomes present an alternative indication of a local temperature, thus increasing an accuracy of the temperature monitoring. In case the release of the contract agent is coupled to the release of a pharmaceutical, a delivery of the pharmaceutical into the matter is validated upon a detection of the contrast agent outside the shield.

A method of magnetic resonance imaging according to the invention comprises the steps of:

positioning a matter to be investigated in an imaging volume of a magnetic resonance apparatus;

acquiring a dataset using the magnetic resonance apparatus, said dataset being representative of a temperature data of the matter and a longitudinal relaxation data of the matter;

reconstructing an image representative of said temperature data and said longitudinal relaxation data.

The method according to the invention is particularly suitable for applications, wherein a substantially real-time simultaneous information on a temperature distribution in the matter and a distribution of a contrast agent in said matter is required. For instance, the method according to the invention can be successfully used for controlling a hyperthermia aimed at liberation of drugs from thermo-sensitive liposomes. The complex nature of MR signals allows for extracting said information, whereby a phase of the MR signal is used for temperature calculation and a magnitude of the MR signal is used for a calculation of a position information of the contrast agent.

The computer program according to the invention comprises instructions for a reconstruction of an image comprising a local temperature data and a local longitudinal relaxation data from a sole dataset of magnetic resonance signals.

A suitable computer program according to the invention comprises instructions to calculate the local temperature from a phase of the magnetic resonance signal and to calculate the local longitudinal relaxation data from a magnitude of the magnetic resonance signal. For said calculations real and imaginary data of the MR signal are used. For example, T1 data can be calculated using the well-known Look-Locker method. For analysis, complex data can be converted to signed magnitude data by using the available phase information. After the calculation of corresponding distributions of the local temperature and the local longitudinal relaxation time, a corresponding image is reconstructed using any suitable per se known reconstruction method. The computer program according to the invention can further comprise instructions to a graphic user interface for reading the image and for subsequent visualization of said image on a suitable display means for a user's analysis.

These and other aspects of the invention will be described in more detail with reference to the figures.

FIG. 1 presents a schematic view of an embodiment of the magnetic resonance imaging system according to the invention.

Figure 2A:
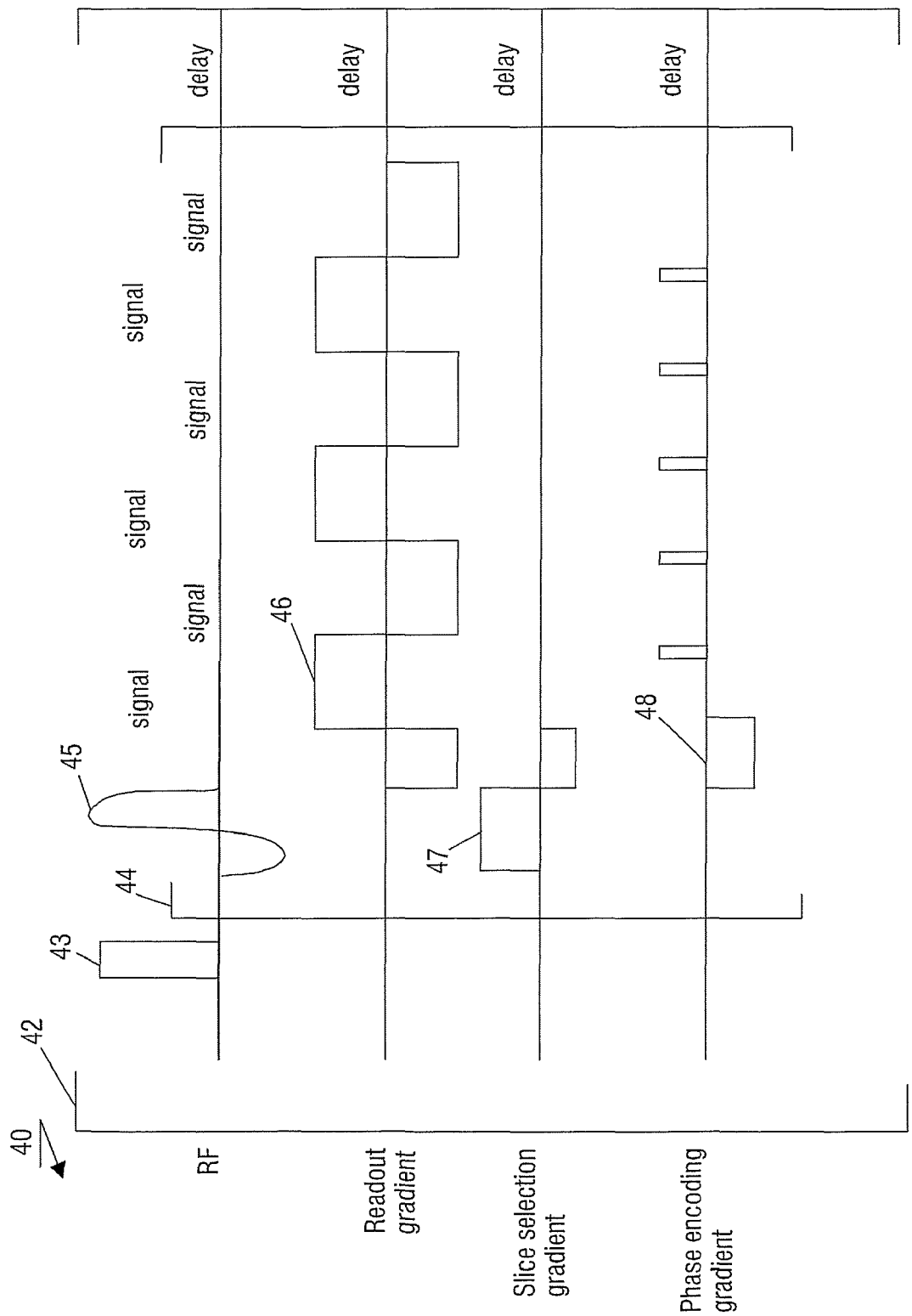

FIG. 2a presents a first embodiment of a first pulse sequence for an acquisition of the dataset according to the invention.

FIG. 2b presents a second embodiment of a second pulse sequence for an acquisition of the dataset according to the invention.

Figure 3:
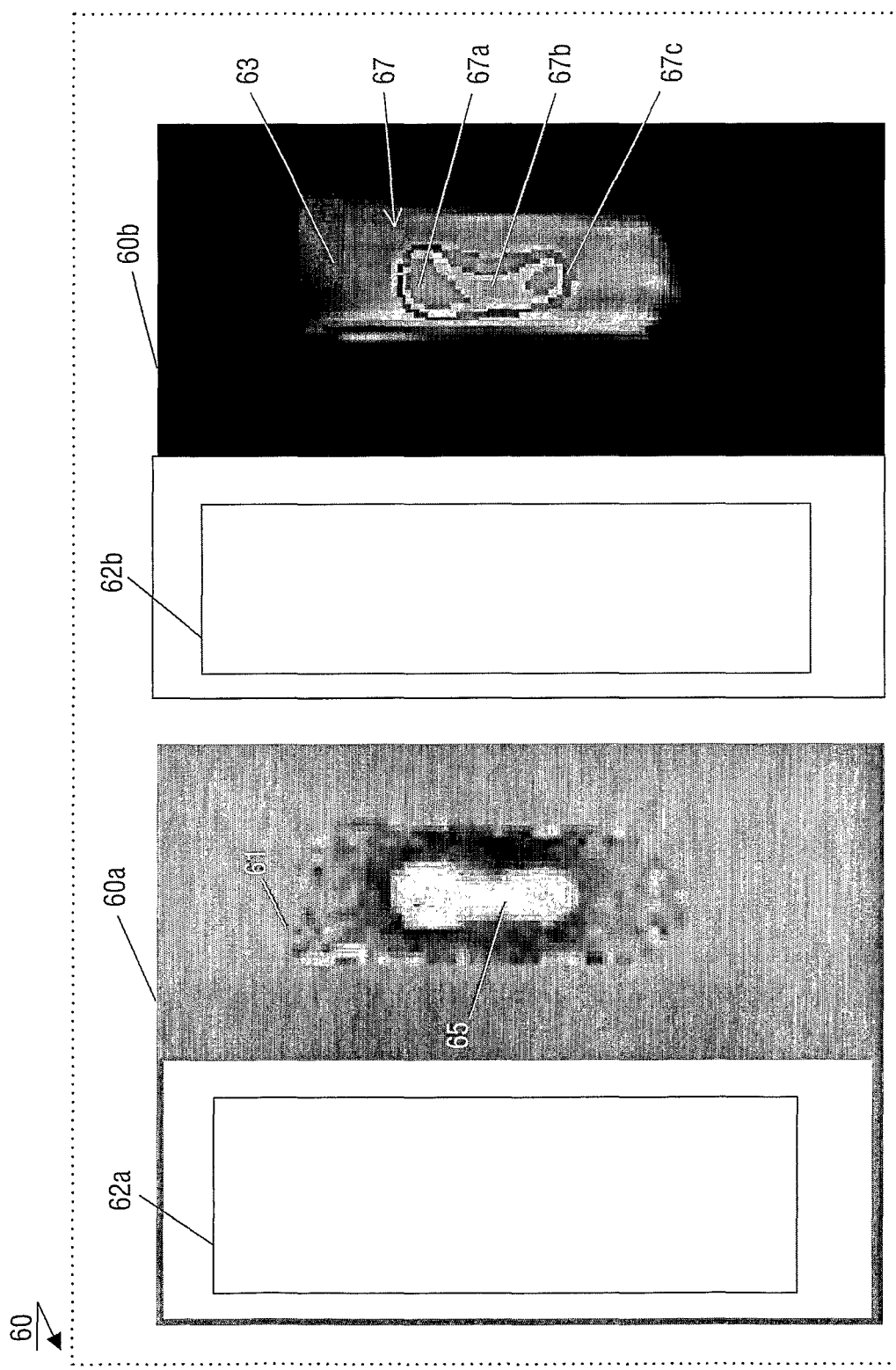

FIG. 3 presents an embodiment of a resulting image provided by the magnetic resonance imaging system according to the invention.

Figure 4:
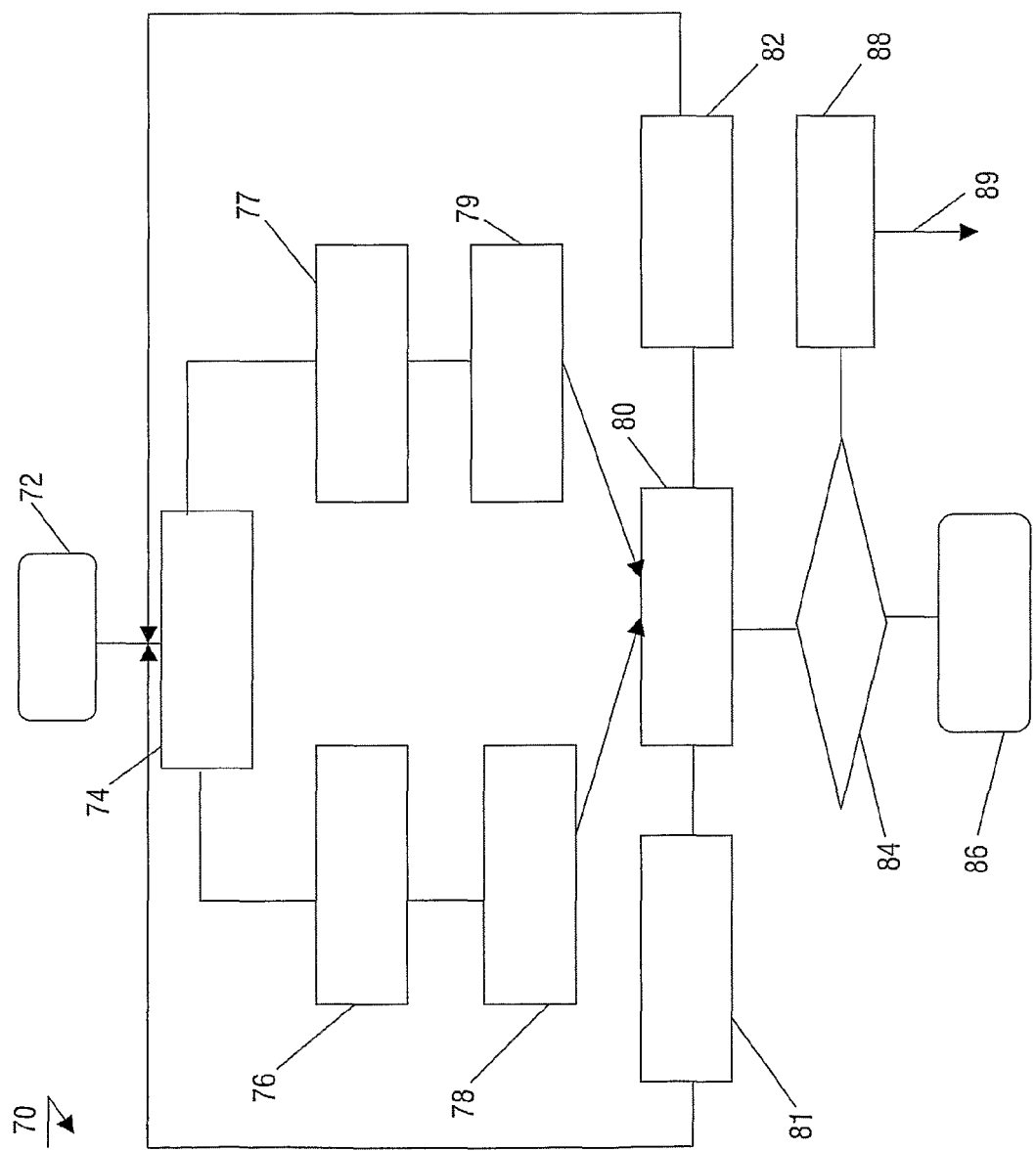

FIG. 4 presents a schematic view of an embodiment of a block-scheme of the computer program according to the invention.

FIG. 1 presents a schematic view of an embodiment of the magnetic resonance imaging system according to the invention. The magnetic resonance imaging system 1 according to the invention comprises a data acquisition system 11, for example a conventional magnetic resonance imaging apparatus comprising a main magnet 12 with an imaging volume (not shown) for receiving therein a suitable object to be investigated. A patient is an example of such an object. In a preferred embodiment the main magnet 12 comprises a superconducting magnet 13, but other types of magnets are contemplated as well. The magnet 12 is arranged to induce a stationary, substantially homogenous magnetic field Bo in the imaging volume. This homogenous magnetic filed causes certain nuclei spins to align with this field. Gradient system (G) arranged for generating field gradients Gx indicated as 14, Gy indicated as 16 and Gz indicated as 17 is provided. The gradient magnetic fields are used to vary the homogenous magnetic field Bo in a pre-defined manner, for example using a linear variation thereof with a distance along the imaging volume. According to the convention, the gradient magnetic fields are arranged orthogonally in X, Y and Z directions, as known by the orthogonally directed arrows 20. The filed Bo is conventionally in the Z direction.

An RF excitation system (10) is provided for generating radio-frequency (RF) pulses for flipping the aligned spins into a transverse plane such as the XY plane or to have a component in the XY plane. The system (10) for flipping the spins comprises RF coils (not shown) in the magnet 12 and a pulse transmitter 18. The pulse transmitter frequency may be supplied by a synthesizer 19 and can be controlled by a control system 21. The control system 21 is arranged to control the time and amplitude of the outputs of the various component parts making up the magnetic resonance apparatus. Usually, the transmitted pulse is supplied from the transmitter 18 through a transmitter-receiver selection switch 22 to an RF coil (not shown) in the magnet. The synthesizer signal is coupled to the transmitter 18 when the system is in the transmitting mode through a second transmitter-receiver switch 23.

In the receiving mode, the RF coil in the magnet senses a response of the investigated object to the RF pulses, for example in the form of a free induction decay signals, including echo signals. The signals received at the RF coil are supplied through switch 22 when it is switched by the control system 21 into the receiving mode to connect the RF coil to the receiver. Separate RF coils can be used for receiving and transmitting within the scope of the invention. The received signal then passes through an analog-to-digital converter 25. The digital output of the converter 25 is applied to an image reconstructor 26, preferably having an associated memory 27. The image reconstructor 26 is arranged to extract thermometry data and longitudinal relaxation time data from the acquired MR signals and to forward corresponding reconstructed images to the display unit 28. It must be noted that within the scope of the invention the term image relates either to a single graphical representation of a plurality of overlaid data, or to a plurality of graphical representations of each data separately. The magnetic resonance imaging system 1 according to the invention is arranged to form the dataset so that it contains both—an information on the thermometry data and an information on the longitudinal relaxation time data. A method of extracting temperature data and longitudinal relaxation data from a single sequence is further discussed with reference to FIGS. 2a and 2b.

The magnetic resonance imaging system 1 according to the invention is particularly suitable to carry out a near real-time monitoring of the local temperature distribution within the object to be investigated and the local change in the longitudinal relaxation time within the same object. This feature enables an accurate control of a hyperthermia, and/or a drug delivery control. The latter is accomplished in case a suitable pharmaceutical is labeled by a contrast agent arrange to induce a local modification of the longitudinal relaxation time T1 of the matter of the object. Thus, upon a detection of a substantial change in a local value of the longitudinal relaxation time, a conclusion about the drug delivery is drawn with high confidence level. Alternatively, in case the contrast agent is provided within the object in an encapsulated form using, for example, a thermo-sensitive liposomes which become permeable to it upon a threshold temperature being reached, a detection of the contrast agent outside the capsule indicates that a certain pre-known temperature level being factually reached. This feature can be used to control an associated heating device. Thus, additionally, the magnetic resonance imaging system 1 according to the invention may be arranged to provide a control signal to a further control means 29 of a heating device 30. The further control signal is preferably arranged to control a heating mode of the device. Additionally, the further control signal can be used to alter a position of a hot spot within the object. Due to a complexity of the MR-signals, providing not only morphological information on the object, but also thermometry data and the longitudinal relaxation data, a control of the heating device can be accomplished in a dynamic mode, whereby a position of the hot spot is changed and is validated in real-time using, for example, a morphological image superimposed on the temperature distribution image. It will be appreciated by those skilled in the art that a plurality of modifications of the way the invention can be practiced is possible without departing its scope.

FIG. 2a presents a first embodiment of a first pulse sequence 40 for an acquisition of the dataset according to the invention. The present embodiment represents a Look-Locker acquisition mode, whereby first a plurality of pulse sequences 42 is defined. The pulse sequence 42 comprises a preparation pulse 43 followed by a series of N repetitions of a set 44. After each excitation pulse 45, an MR signal is collected that contributes to a single image of N images acquired. Data are stored such that the signal acquired after the n-th excitation pulse in the series contributes to the n-th image. Preferably, the preparation pulse is a 180 degrees inversion pulse, however, another value may be used, corresponding, for example to a saturation recovery mode. It must be noted that a presented number of blocks corresponding to EPI is pure illustrative. A person skilled in the art will select a suitable number according to temporal resolution, signal to noise, and image quality requirements. After the sequence 44 is repeated for N times, the whole sequence 42 is repeated for a number of times to fill the k-space i.e, as many times as required to complete the spatial encoding. Thus, according to the invention, N k-spaces that give N complex images (phase and magnitude) after reconstruction are provided. The T1 value is calculated from N resulting magnitude images. Temperature calculation can be carried out in accordance with U.S. 2004/0015071. The Proton Resonant Frequency method for MR-thermometry allows to calculate temperature changes ΔT from changes in signal phase Δφ, using the relation:

$$\Delta T = \Delta\phi / c\gamma TE\, B_0, \text{ where}$$

c is the temperature dependent chemical shift;
γ is the gyromagnetic ratio;
TE is the echo time;
$B_0$ is the value of the magnetic field.

Preferably, for evaluation of Δφ, phase information from all timepoints along the recovery curve are used. Preferably, each of the resulting N images has a corresponding reference image that determines the reference phase. Each of the N phase differences between current and reference images, which are related to temperature, should be equal.

FIG. 2b presents a second embodiment of a second pulse sequence 50 for an acquisition of the dataset according to the invention. This embodiment corresponds to a variable flip angle method, whereby a sequence 54 is repeated until the k-space is complete. The sequence 52 is then repeated for different flip angles. The use of a standard gradient echo read out instead of an EPI readout is not essential, however represents a most typical acquisition mode. In the present example after an excitation pulse 55 is applied together with a slice select pulse 57, a response signal 56 is detected, whereby phase encoding pulses 58a and 58b are being applied. This sequence provides N magnitude images from which T1 can be calculated based on the variation of signal magnitude with flip angle. Also for the implementation of this embodiment an acquisition of a set of reference phase images is required. The phase change is then calculated by comparing the phase of the acquired images to the phase of the reference images.

Although two specific examples illustrating the technical measure of the invention are shown, those skilled in the art will appreciate that any pulse sequence capable of providing simultaneous phase-change data with a T1 data is applicable for practicing the invention. In particular an interleaved sequence whereby pulses for detecting a phase-change alone are being interleaved with pulses directed to detect the magnitude of the MR-signal fall within the scope and is contemplated as well.

FIG. 3 presents an embodiment of a resulting image 60 provided by the magnetic resonance imaging system according to the invention. It must be noted that the image 60 may comprise a plurality of fields 60a, 60b whereto specific data are projected. Alternatively, the image 60 may comprise a single field (not shown) comprising an overlay of at least the temperature data and the longitudinal relaxation time data (not shown). Preferably, the latter also comprises the conventional MR-data of the investigated object.

For the sake of clarity, the current embodiment thus comprises two graphic fields, denoted by 60a and 60b. The former is arranged to visualize longitudinal relaxation data 61. The longitudinal relaxation data may be represented by a relaxation time T1 or by a relaxation rate R1, being a reciprocal of the relaxation time. The image 61 comprises an area 65 corresponding to a contrast agent being arranged to locally induce a change in a value of the longitudinal relaxation time with respect to the surrounding matter. In case the contrast agent 65 was previously encapsulated in a thermo-sensitive liposome (not shown), an event of its spreading beyond the capsule is immediately visualized in the image 61, it being a detection of a certain local temperature. The local change in the longitudinal relaxation data can also be monitored in a different way. For example, in case the contrast agent is associated with a pharmaceutical to be deposited at a target area within a patient being investigated; a propagation of the area 65 can be monitored in real-time and can be on-line compared with anatomical data corresponding to a spatial position of the area 65 at a certain time. This feature enables not only a control of a drug delivery but also a validation of a drug transport to the target. Preferably, the field 60a comprises an area 62a wherein suitable alpha-numerical information for user's convenience is presented.

The image 63 comprises a temperature distribution data obtained using the proton resonance frequency shift method. The thermometry image may be presented as such, but preferably, the image 63 comprises conventional MR-data onto which the thermometry image is overlaid. In this example a color-wash 67a, 67b, 67c is shown, wherein certain color is assigned to a certain temperature range or value. Alternatively, a percentage of the maximum can be color-coded. Still alternatively, an isotherm (not shown) may be used. Preferably, the absolute temperature is presented and is monitored using the image data 67a, 67b, 67c. Preferably, the field 60b comprises an area 62b wherein suitable alpha-numerical information for user's convenience is presented. Still preferably, the magnetic resonance imaging system is arranged to generate a further signal upon an event a certain temperature is reached. Still alternatively said further signal is generated only upon an event both images 61 and 63 confirm a certain temperature value. Advantageously, the further signal is used to control an associated heating device (not shown). For example, the heating device may be switched off upon an event a pre-defined temperature level is reached. Alternatively, the heating device may be reconfigured using the further signal to spatially reposition the area 67 to a different location. This feature is particularly suitable upon an observation that there is a geometric mismatch between the hot spot 67c and an anatomic site in the patient.

FIG. 4 presents a schematic view of an embodiment of a block-scheme 70 of the computer program according to the invention. The computer program is started at step 72 wherein an execution of a suitable code is initiated. At step 74 the computer program according to the invention loads the magnetic resonance dataset comprising and phase data, and longitudinal relaxation data into its operational memory. It must be noted that the computer program may be arranged to carry-out post-processing analysis. Alternatively, said magnetic resonance dataset may be made available to the computer program in real-time. At steps 76, 77 respectively the computer program according to the invention extracts temperature data from the phase shift data and a longitudinal relaxation time data from the signal magnitude data. At step 80 an image reconstruction step is carried out wherein an image representative of a temperature distribution in the object and a local value of the longitudinal relaxation time is constructed. At steps 81, respectively 82 the computer program carries out a suitable monitoring of respective data according to a pre-defined method. For example, an absolute value of the temperature may be an object of the monitoring. Alternatively or additionally an area of an altered longitudinal relaxation time may be the object of monitoring. In case said monitoring does not identify a pre-selected event, it for example being a certain level of the local temperature, the computer program loads a further magnetic resonance data of the same type and updates the image with new data. Upon an event a pre-defined criterion is met, the computer program according to the invention finalizes its operation by, for example immediately stopping at step 86, or by proceeding to a control subroutine 88, whereby a control signal 89 is sent to an associated device (not shown). An example of the associated device may be a controllable heating device, which is arranged to modify its operation upon a receipt the control signal 89. Additionally, the control signal may control the magnetic resonance apparatus, for example to terminate a data acquisition and to transport a patient table to a parking position outside the imaging volume.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance imaging system comprising:
   a data acquisition system including:
      a main magnet which generates a magnetic field in an imaging volume,
      a gradient system which generates a gradient in said magnetic field;
      an RF excitation system which generates a radio-frequency wave in the imaging volume, said radio-frequency wave being configured to interact with a contrast agent encapsulated in a thermo-sensitive shield introduced into matter, positioned in the imaging volume;
      a signal acquisition system which detects a signal representative of a response of the matter and contrast agent to said radio-frequency wave;
   a control system which controls the data acquisition system to generate a dataset including signal phase data and signal magnitude data;
   an image processor which reconstructs based on the dataset, an image representative of: (1) local thermometry data and (2) local longitudinal relaxation data using said phase data and said magnitude data and which generates a further signal upon an event of a detection of the contrast agent outside the shield.

2. The magnetic resonance imaging system according to claim 1, wherein said system further comprises:
   a heating device arranged to locally elevate a temperature in the matter, said magnetic resonance imaging system being further arranged to monitor the local thermometry data in the matter and to control the heating device in accordance with a pre-set control program.

3. The magnetic resonance imaging system according to claim 2, further including:
   a control program comprises a set of instructions for controlling a heating mode.

4. The magnetic resonance imaging system according to claim 3, wherein said heating device is arranged to elevate the local temperature within the matter in a spot, said control program comprising a further set of instructions for controlling a position of said spot.

5. The magnetic resonance imaging system according to claim 1, wherein said system is further arranged to monitor a change in the signal magnitude data and to generate the further signal representative of said change.

6. The magnetic resonance imaging system according to claim 1, wherein said contrast agent is associated with a pharmaceutical to be transported to a target within the matter, a transport of the pharmaceutical being monitored by the image processor based on said signal magnitude data.

7. A method of magnetic resonance imaging comprising:
   positioning an object to be investigated in an imaging volume of a magnetic resonance apparatus, the object comprising a contrast agent encapsulated in a thermo-sensitive shield, said shield being configured to increase its permeability to the contrast agent and/or to surrounding water upon an event of a threshold temperature being reached;
   acquiring a magnetic resonance dataset representative of temperature data and longitudinal relaxation data of the matter object;
   reconstructing an image representative of said temperature data and said longitudinal relaxation data;
   heating region of the object using a heating device at least until a threshold temperature is reached;
   detecting an event of the contrast agent leaving the shield.

8. The method according to claim 7, wherein the method further comprises:
   controlling the heating device in accordance with the temperature data and/or the longitudinal relaxation data.

9. A computer readable medium containing computer instructions for controlling the magnetic resonance apparatus to perform the method according to claim 7.

10. A computer readable medium according to claim 9, wherein said computer instructions control the heading device in accordance with the local temperature data and/or the local longitudinal relaxation data.

11. A magnetic resonance imaging system comprising:
    a data acquisition system including:
       a main magnet configured to generate a magnetic field in an imaging volume,
       a gradient system configured to generate gradients in the magnetic field in the imaging volume;
       an RF excitation system configured to transmit radio-frequency excitation signals in the imaging volume;
       a signal acquisition system configured to detect radio-frequency response signals from a subject in the imaging volume in response to the radio-frequency excitation signals;
    a control system configured to operate the data acquisition system to generate from the response signals a dataset including signal phase data and signal magnitude data;
    an image processing system configured to reconstruct based on said dataset an image representative of (1) local thermometry data and (2) local longitudinal relaxation data using said phase data and said magnitude data;
    a heating device configured to locally elevate a temperature in at least one subregion of the subject;
    the control system further being configured to monitor the local thermometry data in the subject and to control the heating device to control heating of the at least one subregion of the subject in accordance with a pre-set control program.

12. The magnetic resonance imaging system according to claim 11, wherein the control program controls at least one of a temperature and a position of the at least one subregion of the subject.

13. The magnetic resonance imaging system according to claim 11, wherein at least one of a thermo-sensitive pharmaceutical and a thermo-sensitive contrast agent are injected into the subject and the image processing system reconstructs the signal phase data into an image representative of the local thermometry and the signal magnitude data into an image representative of a distribution or location of the thermo-sensitive pharmaceutical or contrast agent.

14. A method of magnetic resonance imaging comprising:
acquiring a magnetic resonance dataset from a subject positioned in an imaging volume of a magnetic resonance apparatus from a subject, which subject has received a thermo-sensitive substance, the dataset being indicative of a temperature distribution in the subject and a longitudinal relaxation distribution in the subject;
reconstructing an image representative of the temperature distribution and at least one of the longitudinal relaxation distribution and a thermo-sensitive substance distribution in the subject.

15. The method according to claim 14, wherein the thermo-sensitive substance is one of a thermo-sensitive contrast agent and a thermo-sensitive pharmaceutical.

16. A magnetic resonance imaging apparatus including at least one processor programmed to control the magnetic resonance imaging apparatus to perform the method according to claim 14.

17. A computer readable medium carrying program code for controlling a computer to perform the method according to claim 14.

* * * * *